United States Patent
Eno et al.

(10) Patent No.: US 11,455,242 B2
(45) Date of Patent: Sep. 27, 2022

(54) SCRUBBER DRIVEN WEAR LEVELING IN OUT OF PLACE MEDIA TRANSLATION

(71) Applicant: Micron Technology, Inc., Boise, ID (US)

(72) Inventors: Justin Eno, El Dorado Hills, CA (US); Samuel E. Bradshaw, Sacramento, CA (US)

(73) Assignee: MICRON TECHNOLOGY, INC., Boise, ID (US)

(*) Notice: Subject to any disclaimer, the term of this patent is extended or adjusted under 35 U.S.C. 154(b) by 174 days.

(21) Appl. No.: 17/062,344

(22) Filed: Oct. 2, 2020

(65) Prior Publication Data
US 2021/0034515 A1    Feb. 4, 2021

Related U.S. Application Data

(63) Continuation of application No. 16/138,867, filed on Sep. 21, 2018, now Pat. No. 10,810,119.

(51) Int. Cl.
*G06F 12/02*     (2006.01)
*G06F 3/06*     (2006.01)
(Continued)

(52) U.S. Cl.
CPC .......... *G06F 12/0246* (2013.01); *G06F 3/061* (2013.01); *G06F 3/0659* (2013.01);
(Continued)

(58) Field of Classification Search
CPC .. G06F 12/0246; G06F 12/0238; G06F 3/061; G06F 3/0659; G06F 3/0679;
(Continued)

(56) References Cited

U.S. PATENT DOCUMENTS 6,886,085 B1 * 4/2005 Shut .................. G06F 12/121
                                                           711/143
6,919,736 B1 * 7/2005 Agrawal .......... H03K 19/17796
                                                           326/38
(Continued)

OTHER PUBLICATIONS

Li-Pin Chang and Li-Chun Huang. 2011. A low-cost wear-leveling algorithm for block-mapping solid-state disks. SIGPLAN Not. 46, 5 (May 2011), 31-40. (Year: 2011).*

(Continued)

*Primary Examiner* — Ramon A. Mercado
(74) *Attorney, Agent, or Firm* — Nicholson De Vos Webster & Elliott LLP

(57) ABSTRACT

A process for wear-leveling in a memory subsystem where references to invalidated chunks and a write count for each of the invalidated chunks of a memory subsystem are received by a wear-leveling manager. The wear-leveling manager orders the received references to the invalidated chunks of the memory subsystem in a tracking structure based on the write count of each of the invalidated chunks, and provides a reference to at least one of the invalidated chunks based on the ordering from the tracking structure to a write scheduler to service a write request, wherein the memory subsystem is wear-leveled by biasing the order of the invalidated chunks to prioritize low write count chunks.

20 Claims, 7 Drawing Sheets

(51) Int. Cl.
*G06F 13/16* (2006.01)
*G11C 16/34* (2006.01)

(52) U.S. Cl.
CPC ........ *G06F 3/0679* (2013.01); *G06F 13/1642* (2013.01); *G11C 16/349* (2013.01); *G06F 2212/1036* (2013.01); *G06F 2212/7211* (2013.01)

(58) Field of Classification Search
CPC ......... G06F 13/1642; G06F 2212/1036; G06F 2212/7211; G06F 2212/1024; G06F 2212/1028; G06F 2212/7201; G06F 2212/7205; G06F 2212/7204; G11C 16/349; G11C 13/0035; G11C 13/0004
See application file for complete search history.

(56) References Cited

U.S. PATENT DOCUMENTS

| | | | | |
|---|---|---|---|---|
| 8,874,835 | B1* | 10/2014 | Davis | G06F 12/0238 711/156 |
| 9,367,448 | B1* | 6/2016 | Botelho | G06F 3/0652 |
| 9,431,054 | B1* | 8/2016 | Goker | H03M 13/3761 |
| 10,248,333 | B1* | 4/2019 | Shah | G06F 12/1009 |
| 2010/0318719 | A1* | 12/2010 | Keays | G06F 12/0246 711/E12.001 |
| 2011/0107019 | A1* | 5/2011 | Pan | H04L 1/0055 714/752 |
| 2011/0231730 | A1* | 9/2011 | Allen | G06F 12/0246 711/E12.008 |
| 2013/0051144 | A1* | 2/2013 | Suzuki | G06F 3/064 365/185.11 |
| 2014/0181430 | A1* | 6/2014 | Bruso | G06F 3/064 711/156 |
| 2015/0347038 | A1* | 12/2015 | Monteleone | G06F 3/0616 711/103 |
| 2015/0347296 | A1* | 12/2015 | Kotte | G06F 3/064 711/103 |
| 2016/0124848 | A1* | 5/2016 | Bellorado | G06F 12/0246 711/103 |
| 2016/0239383 | A1* | 8/2016 | Feng | G06F 3/0679 |
| 2016/0328179 | A1* | 11/2016 | Quinn | G06F 12/0246 |
| 2020/0097394 | A1* | 3/2020 | Eno | G06F 3/0679 |

OTHER PUBLICATIONS

Xian Zhang and Guangyu Sun. 2017. Toss-up Wear Leveling: Protecting Phase-Change Memories from Inconsistent Write Patterns . In Proceedings of the 54th Annual Design Automation Conference 2017 (DAC '17). Association for Computing Machinery, New York, NY, USA, Article 3, 1-6. (Year: 2017).*
Final Office Action, U.S. Appl. No. 16/138,867, dated Apr. 16, 2020, 14 pages.
Non-Final Office Action, U.S. Appl. No. 16/138,867, dated Oct. 3, 2019, 11 pages.
Notice of Allowance, U.S. Appl. No. 16/138,867, dated Jun. 18, 2020, 7 pages.

* cited by examiner

SCRUBBER DRIVEN WEAR LEVELING IN OUT OF PLACE MEDIA TRANSLATION

CROSS-REFERENCE TO RELATED APPLICATIONS

This application is a continuation of U.S. patent application Ser. No. 16/138,867, filed Sep. 21, 2018, which is hereby incorporated by reference.

TECHNICAL FIELD

The present disclosure generally relates to memory subsystem management, and more specifically, relates to a wear-leveling scheme for memory subsystems.

BACKGROUND ART

A memory subsystem can be a storage system, such as a solid-state drive (SSD), and can include one or more memory components that store data. The memory components can be, for example, non-volatile memory components and volatile memory components. In general, a host system can utilize a memory subsystem to store data at the memory components and to retrieve data from the memory components.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to wear-leveling process implemented in a memory subsystem. A memory subsystem is also hereinafter referred to as a "memory device." An example of a memory subsystem is a memory module that is connected to a central processing unit (CPU) via a memory bus. Examples of memory modules include a dual in-line memory module (DIMM), a small outline DIMM (SO-DIMM), a non-volatile dual in-line memory module (NVDIMM), etc. Another example of a memory subsystem is a storage device that is connected to the central processing unit (CPU) via a peripheral interconnect (e.g., an input/output bus, a storage area network, etc.). Examples of storage devices include a solid-state drive (SSD), a flash drive, a universal serial bus (USB) flash drive, and a hard disk drive (HDD). In some embodiments, the memory subsystem is a hybrid memory/storage subsystem. In general, a host system can utilize a memory subsystem that includes one or more memory components. The host system can provide data to be stored at the memory subsystem and can request data to be retrieved from the memory subsystem.

The embodiments include a wear-leveling manager that provides an efficient wear-leveling process. The wear-leveling manager can operate in a memory subsystem that utilizes an out-of-place translation layer such as a flash translation layer. The wear-leveling manager can be implemented in or include a media management agent and/or garbage collection related processes. In some embodiments, the wear-leveling manager identifies low write count chunks (e.g., managed units) of the memory subsystem. The wear-leveling manager invalidates the low write count chunks. The wear-leveling manager can queue these invalidated low write count chunks to be utilized for write requests thereby distributing wear to these low write count chunks. A cartridge manager, which can be a part of the wear-leveling manager or a separate component, can further organize invalidated chunks into groupings referred to as 'cartridges.' A write scheduler in a controller of the memory subsystem consumes the cartridges to service write requests in the memory subsystem. The cartridge manager organizes chunks to minimize partition collision when data is written to the chunks that make up the cartridge.

The embodiments of the wear-leveling manager and cartridge manager provide advantages in wear-leveling with a highly efficient wear-leveling of the memory subsystem, which improves wear evenness in the memory subsystem thereby increasing the longevity or endurance capacity of the memory subsystem. The wear-leveling manager can manage proximity disturb effects such that separate proximity disturb management mechanisms do not have to be implemented such as proximity disturb counter tracking and associated remediation costs.

Figure 1:
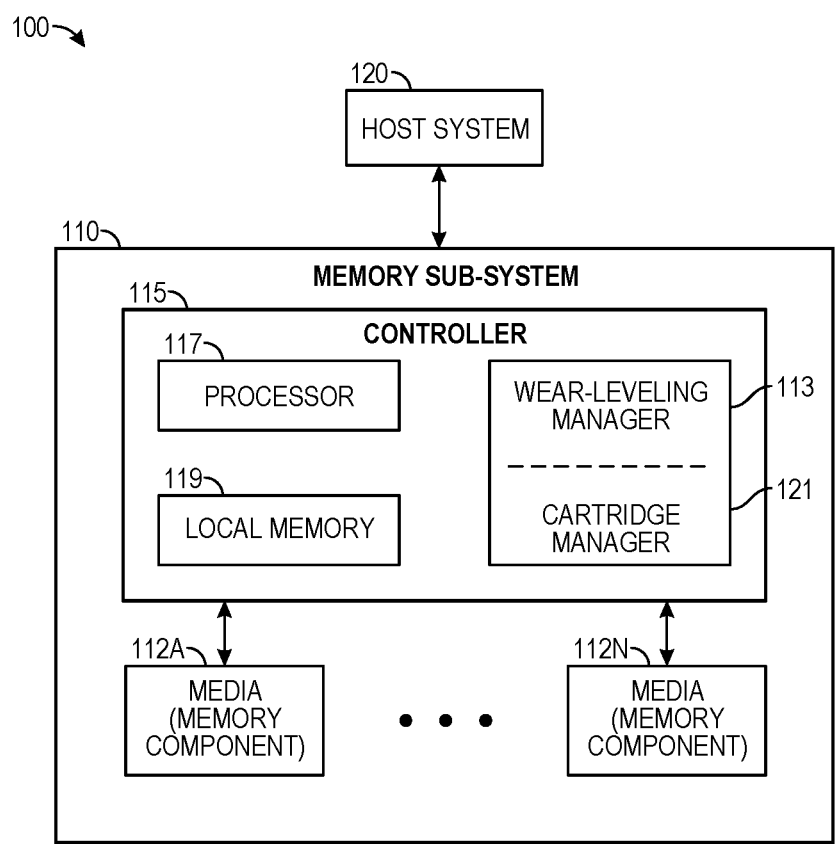
FIG. 1 illustrates an example computing environment that includes a memory subsystem in accordance with some embodiments of the present disclosure.

FIG. 1 illustrates an example computing environment 100 that includes a memory subsystem 110 in accordance with some embodiments of the present disclosure. The memory subsystem 110 can include media, such as memory components 112A to 112N. The memory components 112A to 112N can be volatile memory components, non-volatile memory components, or a combination of such. In some embodiments, the memory subsystem is a storage system. An example of a storage system is an SSD. In some embodiments, the memory subsystem 110 is a hybrid memory/storage subsystem. In general, the computing environment 100 can include a host system 120 that uses the memory subsystem 110. For example, the host system 120 can write data to the memory subsystem 110 and read data from the memory subsystem 110.

The host system 120 can be a computing device such as a desktop computer, laptop computer, network server, mobile device, or such computing device that includes a memory and a processing device. The host system 120 can include or be coupled to the memory subsystem 110 so that the host system 120 can read data from or write data to the memory subsystem 110. The host system 120 can be coupled to the memory subsystem 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory subsystem 110. The host system 120 can further utilize an NVM Express (NVMe) interface to access the memory components 112A to 112N when the memory subsystem 110 is coupled with the host system 120 by the PCIe interface. The physical host interface can provide an interface for passing control, address, data, and other signals between the memory subsystem 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random-access memory (DRAM), synchronous dynamic random-access memory (SDRAM), phase change memory (PCM), magneto random access memory (MRAM), negative-or (NOR) flash memory, and an electrically erasable programmable read-only memory (EEPROM). The PCM can be any type of two-dimensional or three-dimensional array of non-volatile memory cells. An array of non-volatile memory can perform bit storage based on a change of bulk resistance, in conjunction with a stackable cross-gridded data access array. Additionally, in contrast to many flash-based memories, non-volatile PCM memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

In one embodiment, PCM technology that changes the bulk resistance of the material constructs an array of non-volatile storage elements of memory devices 112A to 112N, including an array that is three-dimensional (3D). In one embodiment, chalcogenide glass provides the material to construct the storage elements, as well as the corresponding selectors. The plurality of dice forming the memory components 112A to 112N may be arranged in various ways. In one embodiment, the dice 1 through n (where "n" is an integer) of memory devices 112A to 112N may represent the dice of the various described embodiments of this disclosure. The memory system controller 115 couples to memory components 112A to 112N via access lines, such as bitlines, wordlines, control lines, to access the memory components 112A to 112N to perform various operations, such as read, write, erase, etc. The number of dice forming memory components 112A to 112N varies depending on how much memory is desirable or designed for a system. In an example, 128 dice could provide 2 terabytes of storage, while 256 dice provide 4 terabytes.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory subsystem 110, including handling communications between the memory subsystem 110 and the host system 120. In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the controller 115, in another embodiment of the present disclosure, a memory subsystem 110 may not include a controller 115, and may instead rely upon external control (e.g., provided by an external host, or by a processor or controller separate from the memory subsystem).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory components 112A to 112N.

The memory subsystem 110 includes a wear-leveling manager 113 that can increase the operational life of the memory components 112A to 112N. In some embodiments, the controller 115 includes at least a portion of the wear-leveling manager 113. For example, the controller 115 can include a processor 117 (processing device) configured to execute instructions stored in local memory 119 for performing the operations described herein. In some embodiments, the wear-leveling manager 113 is part of the host system 120, an application, or an operating system.

The wear-leveling manager 113 can implement a wear-leveling process to identify low write count chunks (e.g., managed units) to invalidate and to organize these invalidated chunks in the memory components 112A to 112N to provide them to a write scheduler in an order that improves the evenness of the wear of the memory components 112A to 112N. The wear-leveling manager 113 can be implemented as a function or component of a garbage collector. Similarly, the wear-leveling manager 113 can encompass at least some of the functions of the garbage collector. For example, the wear-leveling manager 113 can implement a scrubber function that is also part of or independent of the garbage collector. The garbage collector functions to manage invalid chunks of the memory subsystem 110 and can be part of the controller 115. A scrubber function is a function that traverses the memory components 112A to 112N to refresh data in the chunks stored therein in a manner that is consistent with the underlying technology. The primary function of a scrubber function is to manage the media based on residual bit error rate (RBER) and latency reduction and mitigating intrinsic memory component issues through periodic data inversion, i.e. periodic data rewriting in the memory subsystem 110 where the bit pattern is inverted or toggled. The scrubber function can traverse the memory components 112A to 112N to re-write chunks that have metrics (e.g., RBER or latency) that meet defined criteria. In some cases, the re-write of chunks causes a free chunk to be pulled (e.g., from a FIFO or similar tracking structure as discussed herein below) to store the valid data and the old chunk to be invalidated. The wear-leveling manager 113 is given an additional task to track write counts of chunks when a chunk is written or overwritten. With a tracked write count a 'skew' or unevenness in the writes to chunks can be detected. The wear-leveling manager 113 can invalidate valid but low write count chunks to mix them into a pool of free chunks for consumption by a write scheduler to service write requests from the host system 120. The wear-leveling manager 113 utilizes mapping tables and a tracking structure, but can leverage the in-place overwrite capabilities of PCM media. The efficiency of the wear-leveling process implemented by the wear-leveling manager 113 can be varied by configuring overprovisioning levels as a trade off with efficiency. Near perfect wear-leveling can be attained with relatively low overprovisioning levels. Further details with regards to the operations of the wear-leveling manager 113 are described below.

In further embodiments, the wear-leveling manager 113 can include a cartridge manager 121, or the cartridge manager 121 can be an independent component. The cartridge manager 121 can organize chunks (e.g., managed units) that have been over-written or otherwise invalidated. The chunks can be ordered into a sequence or structure referred to herein as a 'cartridge.' The cartridge, as described further herein below, is structured to be assigned to service incoming write requests such that data of the write requests can be written to the memory components 112A to 112N without partition collision, as described in further detail herein below. The partition collision avoidance and wear-leveling processes can be combined or can be implemented independently.

PCM based media and similar technologies can withstand a fixed number of write cycles before the bit error rates begin to be practically unmanageable. A wear-leveling scheme can be employed to maintain a static storage capacity throughout the rated lifetime of any memory component based on this technology. The number of cycles before "failure" of these PCM based memory components is high compared to NAND based memory components. The embodiments provide a wear-leveling process that is suitable for PCM based media and similar technology.

The embodiments provide a wear-leveling manager 113 that tracks write counts for units of memory components. These units can be 'chunks,' which, as used herein, refers to units that are of any size or granularity. In some cases, the wear-leveling manager 113 can use chunks that are block sized. 'Blocks,' as used herein, refer to chunks that are arbitrary multiples of a managed unit size down to a single managed unit. A 'managed unit,' as used herein, refers to a unit that is a minimum atomic write granularity for a memory subsystem.

The controller 115 can implement address translation to enable the host system 120 to utilize a different logical address space from the physical address space of the memory subsystem 110. The controller 115 can perform logical to physical address translation. In some embodiments, a flash translation layer (FTL) or similar translation layer may be implemented in the controller 115 as part of the interface between the memory subsystem 110 and host system 120. Log structured FTLs can be utilized with NAND media due to the erase-before-write and sequential-programming within erase block limitations of NAND media. These FTL technologies utilize a set of translation tables that map logical addresses to physical address. PCM media, however, can utilize in-place overwrite that can simplify the logical to physical address translation layer for PCM media. In-place overwrite supporting media can utilize an algorithmic address translation of logical and physical addresses (i.e., a function can translate the logical address to the physical address without the need of mapping tables). However, algorithmic address translation can subject the media to read and write skews that are inherent to the workload of the host system 120. The workload, i.e., the writes to the memory subsystem 110 from the host system 120, are not evenly distributed causing uneven wear.

Additional benefits of the embodiments include defect management, power consumption management, a-priori channel conflict resolution, write amplification reduction, proximity disturb management, and performance. Defect management is improved by enabling regular offline (e.g., unmapped) media health assessment using the tracked write counts, which enables graceful capacity degradation by retiring bad chunks (i.e., high write count chunks). Power consumption is improved by presetting chunks invalidated by the wear-leveling manager before being written by a write scheduler thereby requiring fewer bits to be flipped during the subsequent write, which diminished peak power consumption. Channel conflict resolution is improved by staging chunks in the tracking structure such that channel conflicts are pre-resolved. This simplifies channel scheduling and eliminates a need for reorder buffers for writes.

The embodiments of the wear-leveling process allow for write amplification reduction as a trade off against wear evenness. While the indirect out of place writing of the embodiments can increase write amplification compared to write in place operation, this can be managed with the improved wear evenness of the embodiments. The use of indirection tables in the embodiments can support any number and variety of metadata flags, similar to NAND FTLs, which enables features like trimming, discarding, and eliminating media reads of unmapped media and returning a deterministic data pattern.

In the embodiments, the wear-leveling manager 113 can include a set of logical indirection tables to assist in the translation of logical addresses from write requests of the host system 120 into physical addresses of the memory subsystem 110. In one example embodiment, the indirection tables include a set of entries that map logical addresses as associated metadata to a set of physical addresses. The indirection table can be logical address indexed. The indirection table can be stored and maintained in a separate memory (e.g., a DRAM) in the controller 115. In some embodiments, there can be fewer host logical addresses than physical addresses and not all chunks may be simultaneously mapped. The indirection table entries can reference any chunk. These tables can be initialized to be empty such that all chunks are considered spare (i.e., unmapped) and sorted into the tracking structure to service write requests.

Figure 2:
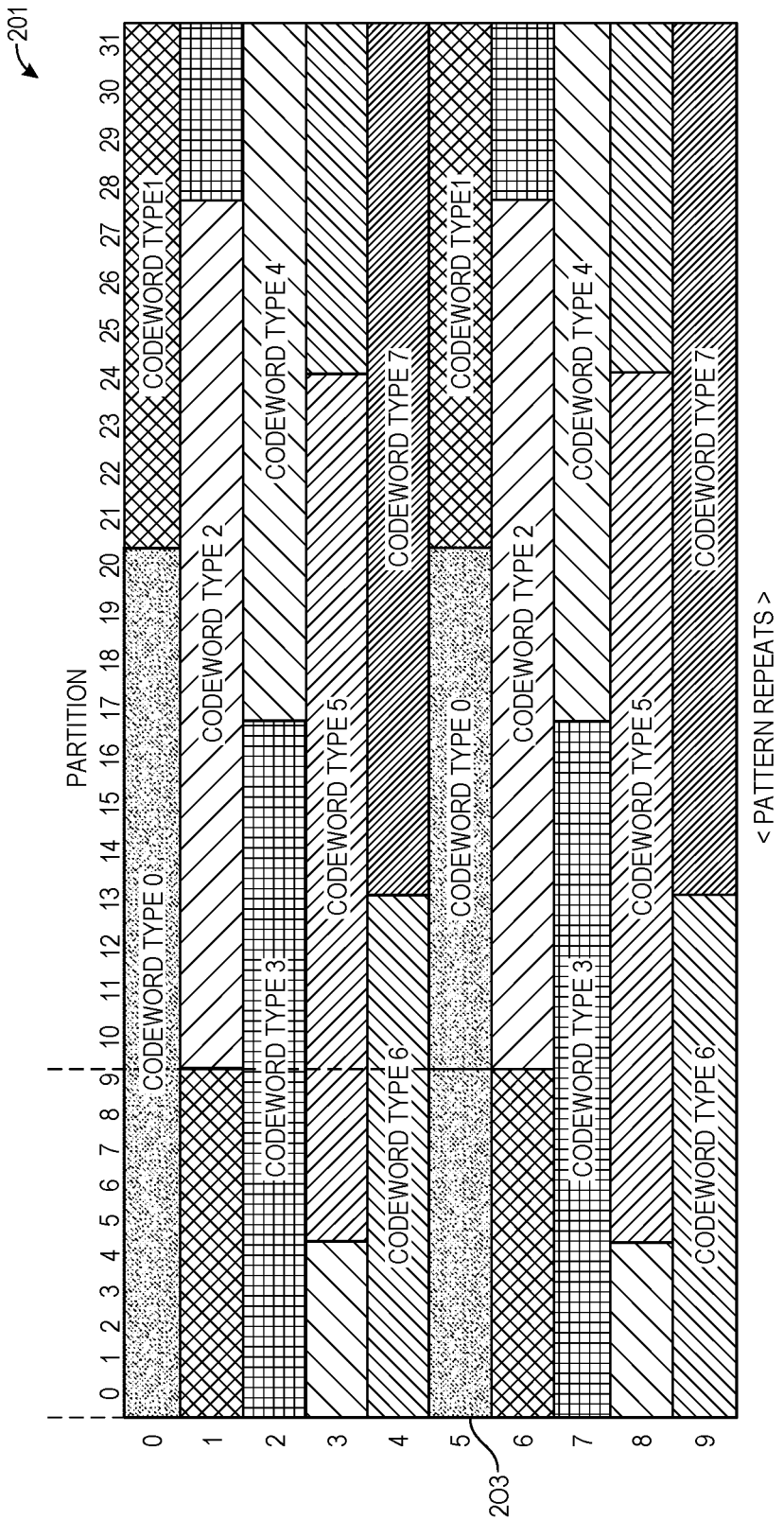
FIG. 2 is a diagram of an example set of codewords organized by codeword type to avoid partition collision.

FIG. 2 is a diagram of a set of codewords stored in a set of pages and across a set of partitions illustrating the problem of partition collision. The diagram illustrates an example organization of codewords stored in a portion of a die (e.g., in one of the memory components 112A to 112N). Codewords are sets of bits including user data and metadata. The metadata can include parity data and the codewords provide a unit for error correcting code (ECC) functions. Each codeword is stored in a specific die of a memory component. A set of the codewords that occupy the same position across a set of dies, i.e., the set of codewords are striped across the set of dies form a chunk such as a managed unit. The partitions are a sub-division of a die. Pages are sub-divisions of partitions. The pages are addressable units. For example, a page can be a 16 Byte addressable unit in a partition. In this example, a partition can include 67,108,864 pages capable of storing 1 Gigabyte of data.

In media types such as PCM, partitions are independent address bands on a die. Operations performed on an address band to move data to or from a partition conform to inter-command spacing rules. These spacing rules govern spacing between commands and data being presented on a bus of the memory components 112A to 112N, such as a set of dice. The media type of the memory components 112A to 112N and the controller 115 also define additional limitations on operations including rules related to write-to-write, write-to-read, and read-to-write spacing and delay. In addition, the controller 115 can define delays for operations on different partitions, same partitions, and same addresses. The controller 115 can provide improved throughput by processing operations with access patterns that move across partitions enabling command and data pipelining on the bus of the memory components 112A to 112N. Accesses to data in partitions that do not have a pattern that conforms to the defined delays can result in partition collision that introduces delay in command execution and data movement. In particular, a controller 115 may be forced to introduce time delays on the bus between two sequential write operations targeting the same partition. These time delays are an order of magnitude larger than sequential write operations that target different partitions. The wear-leveling manager 113 and/or the cartridge manager 121 organize a free pool of chunks for serving write requests to avoid this partition collision and thereby avoid these time delays on the bus of the memory components 112A to 112N.

The example in FIG. 2 demonstrates an example organization of codewords to avoid partition collision. In the illustrated example, a portion of the memory components 112A to 112N is shown. In the example, there are 32 partitions each having pages 0 to N. Partition collision is avoided in this example where a write of a codeword 203 is followed by a subsequent write of codeword 201. Although these two codewords share partitions 0-7, partition collision is avoided by scheduling a write of codeword 203 before the write of codeword 201. A write scheduler must follow a spacing delay that is required before writing codeword 203 to partitions 0-7, because codeword 203 is being written to the same partition as codeword 201. However, the write scheduler writes in increasing order and the write of codeword 201 begins with partitions 20-31. By the time the write schedule begins writing codeword 201 to partitions 0-7 the spacing delay is satisfied and the remainder of codeword 201 can be written without any unnecessary delay.

The wear-leveling manager 113 and/or the cartridge manager 121 can utilize codeword type sequentially to avoid partition collision. The wear-leveling manager 113 and/or cartridge manager 121 can identify a set of codeword types and organize the pool of free chunks such that corresponding codewords are sequenced by codeword type, which ensures partition collision is avoided when a write scheduler follows the order of the codeword types.

FIG. 2 also illustrates how the codewords can be organized by codeword type to avoid partition collision. In the examples, the set of organized codewords, referred to as a cartridge, have a 20-page codeword layout with a repeating pattern. In the example memory components 112A to 112N there are 32 partitions. In the cartridge there are 8 codeword types. Since partitions are semi-independent, the cartridge layout schedules around the fixed set of possible partition collisions for optimal write throughput. A codeword type indicates a position in the repeating codeword sequential pattern. Different numbers of codeword types can be identified depending on the size and organization of the memory subsystem 110. In this example, codeword types 0-7 are used and the identified codewords in codeword type order can be written without partition collision.

Thus, a cartridge is a logical grouping of chunks, e.g., managed units. Each chunk is composed of one or more codewords of the same codeword type. The chunks in a given cartridge are ordered from codeword type 0 to N, where N is the last codeword type for a memory subsystem 110. A cartridge has exactly one of each chunk of each codeword type. For example, the illustrated set of codewords can be divided into two cartridges, each having one of each of codeword type 0 to 7. When a full cartridge of free (i.e., not mapped in the indirection tables) chunks is available in a tracking structure, the write scheduler can service incoming write requests by writing data sequentially to the chunks of the cartridge without partition collision causing bus dead time, thereby maximizing bus utilization and write throughput.

Figure 3:
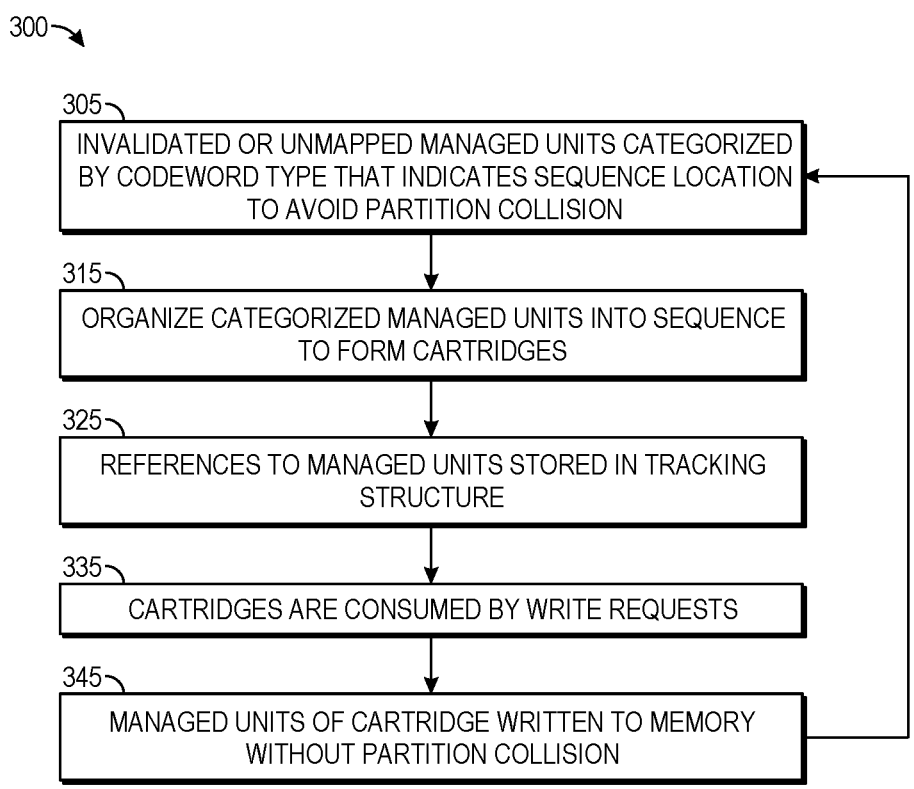
FIG. 3 is a flow diagram of one embodiment of a process for organizing a cartridge.

FIG. 3 is a flow diagram of one example process of chunk organization by codeword type. The chunk organization process can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, the wear-leveling manager 113 or cartridge manager 121 can implement this process to reduce partition collision and eliminate bus dead time. For sake of clarity and conciseness the process is described as being implemented by a cartridge manager 121 and the chunk granularity is described as being a managed unit. However, the wear-leveling manager 113, a processing device (e.g., processor 117), or similar components of a controller 115 can implement the partition collision reduction process. Similarly, other chunk sizes could be utilized. The cartridge manager 121 categorizes the unmapped or invalidated managed units according to a codeword type that indicates a location in a sequence of codewords that is utilized to avoid partition collision (Block 305). The cartridge manager 121 categorizes managed units by location where each codeword type has a unique starting position. With any managed unit physical address, the cartridge manager 121 can determine starting partition by converting a physical address to starting partition and page offset. The cartridge manager 121 can map this position to the codeword type. The codeword type indicates a location of a codeword in a die or similar structure of the memory components 112A to 112N relative to other codewords, such that sequential writes according to a particular order of codeword types can avoid partition collision and dead bus time. The cartridge manager 121 can then sort the categorized managed units according to their codeword type to form a cartridge or a partial sequence of the codewords according to the codeword type (Block 315).

The cartridge manager 121 can utilize a tracking structure to store the categorized and sorted managed units (Block 325). A tracking structure can be any data structure stored in a local memory such as a DRAM in the controller 115. In one example embodiment, the tracking structure is a queue with a head and tail. In some embodiments, the queue can be a first in first out (FIFO) data structure. The cartridge manager 121 places references to each categorized managed unit in the tracking structure to form cartridges or to maintain the codeword sequence that enables partition collision avoidance. References can be any type of pointer, address, or similar locator for a categorized managed unit in the memory subsystem 110. In further embodiments, the cartridge manager 121 can manage and track multiple queues or sequences of managed units using the references to prepare multiple cartridges simultaneously.

As write requests are received by a controller 115, a write scheduler can use a complete cartridge or a properly sequenced set of codewords as readied in the tracking structure (Block 335). The controller 115 can select the cartridge or ordered managed units at the head of a queue, in one embodiment. In an embodiment with multiple queues, a distribution algorithm in the form of a weighted round robin or similar scheme selects a cartridge or sequence of ordered managed units. The controller 115 can then write to the managed units of the selected cartridge or the set of ordered managed units selected in sequence to service write requests without incurring partition collision or dead bus time (Block 345).

Figure 4:
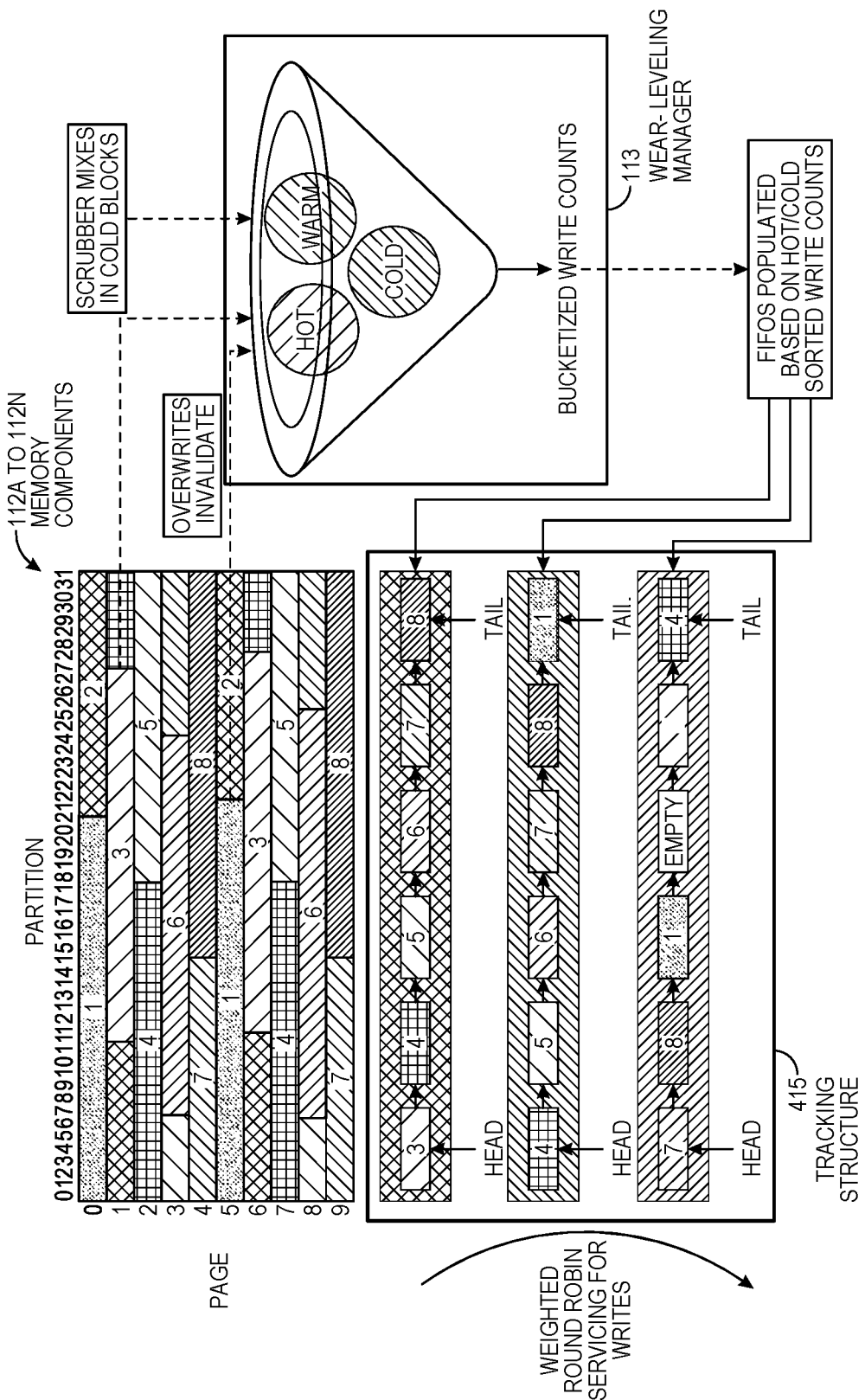
FIG. 4 is a diagram of one embodiment of wear-leveling process components.

FIG. 4 is a diagram of one embodiment of a wear-leveling scheme that can be used in conjunction with or independent of the partition collision avoidance scheme. While the example is described in relation to an implementation where the above described partition collision avoidance scheme is utilized, one skilled in the art would understand that the wear-leveling process can be implemented without and independent of the partition collision avoidance scheme. In the example implementation, the controller 115 overwrites managed units in the memory subsystem 110 by write requests with host system 120 data. The wear-leveling manager 113 can also invalidate managed units by the scrubber function. In these cases, the wear-leveling manager 113 updates write count information for the overwritten or invalidated chunks (e.g., managed units). The wear-leveling manager 113 can maintain write count information for each chunk as part of the metadata of the chunk or in a separate data structure such as the tracking structure 415. The write count data can include a physical address or similar identifier for a chunk along with a count of the number of times the chunk has been written.

The wear-leveling manager 113 can utilize the tracking structure 415 to sort the invalidated chunks to be utilized for servicing write requests by a write scheduler of the controller 115. The wear-leveling manager 113 can sort invalid chunks into different buckets based on their write counts. The wear-leveling manager 113 can have any number of different buckets or categories for the invalid chunks. In one example, the wear-leveling manager 113 groups the invalid chunks into groups with high write counts, average write counts, and low write counts. In the illustrated example, these groups are referred to as hot (high write count), warm (average write count), and cold (low write count). The wear-leveling manager 113 can then place the sorted invalid chunks into the tracking structure 415 using references to the corresponding invalid chunks.

In one example embodiment, the tracking structure 415 includes a set of FIFOs with a FIFO for each category or bucket utilized by the wear-leveling manager 113. As the references to the invalid chunks are placed into the corresponding FIFOs, the wear-leveling manager 113 or the tracking structure 415 can implement a distribution algorithm to manage which of the FIFOs are to be utilized to service each write request. In the illustrated example, the write requests draw from the set of FIFOs according to a weighted round robin scheme. The weighted round robin scheme biases selection from the low write count (i.e., cold) FIFO such that the chunks with low write counts are more likely to be selected and therefore overwritten. Any selection algorithm can be utilized that promotes even wear over the chunks of the memory subsystem 110. The weighting of the selection algorithm and the boundaries for the buckets or categories of invalid chunks can be fixed or dynamically updated by the wear-leveling manager to evenly distribute the workload of write requests over all of the chunks in the memory subsystem 110.

In some embodiments, the wear-leveling manager does not place invalid chunks in a strict FIFO in the tracking structure 415. The wear-leveling manager 113 and/or the cartridge manager 121 can place the references to the invalid chunks into the tracking structure 415 according to codeword type to form cartridges or sequences of codewords based on codeword type to avoid partition collision and bus dead time. In this example, the cartridge manager 121 categorizes the chunks according to codeword type and as the invalid chunks are placed in FIFOs in the tracking structure 415. The cartridge manager 121 further sorts the invalid chunks according to codeword type, as illustrated with the numbers of each invalid chunk indicating codeword type.

In some embodiments, the wear-leveling manager 113 as it traverses the memory subsystem 110 to perform the scrubber function can be biased to invalidate low write count chunks that are traversed even if other criteria for invalidating the chunk are not present. The invalidation of low write count chunks keeps a pool of such chunks available for wear-leveling by filling the corresponding low write count FIFO or similar structure. In addition, the wear-leveling manager 113 can be configured to invalidate low write count chunks that have a codeword type that is needed to complete a cartridge in the tracking structure 415 or a codeword type-based sequence.

Figure 5:
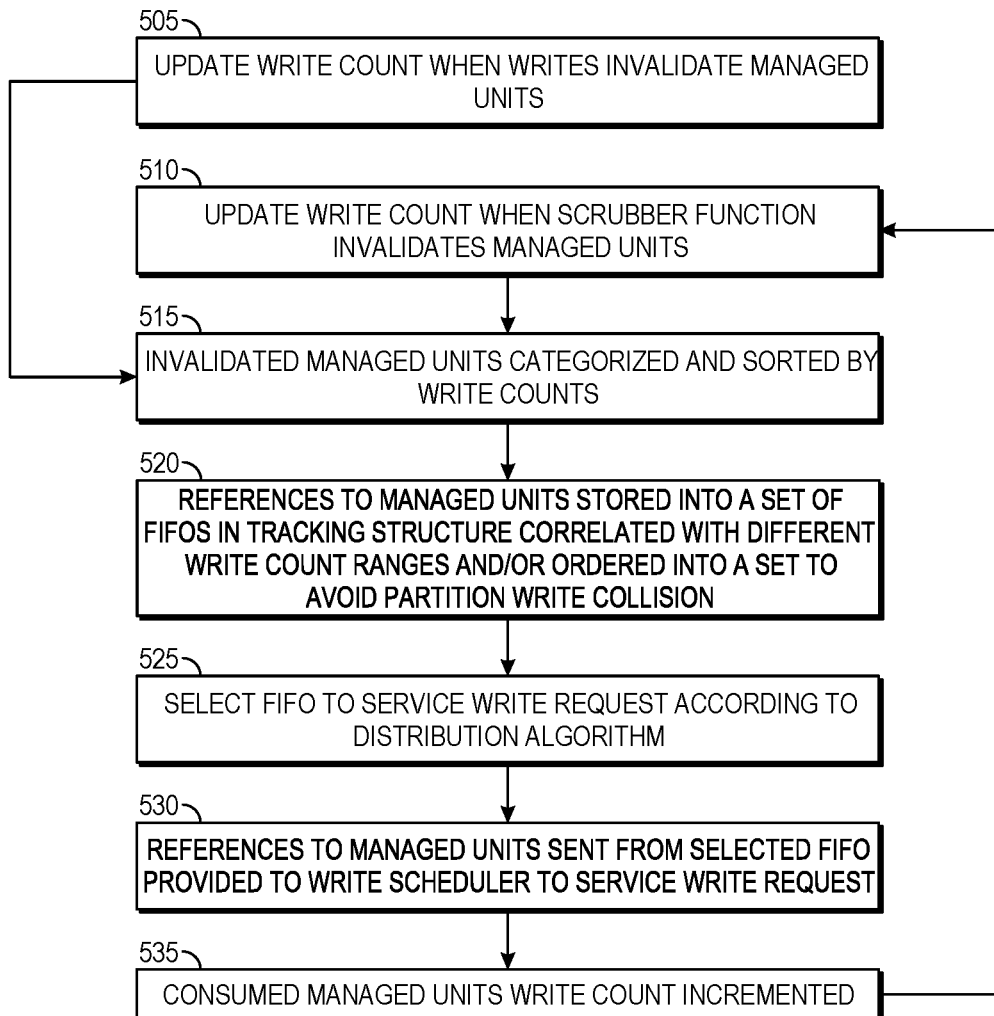
FIG. 5 is a flow diagram of one embodiment of a process for wear-leveling.

FIG. 5 is a flow diagram of a process of the wear-leveling manager 113. The wear-leveling manager 113 process can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The wear-leveling manager 113 updates write counts for chunks, e.g., managed units as indicated in the illustrated example, that are invalidated by writes of host system 120 data (Block 505) or when the scrubber function invalidates a chunk (Block 510). The controller 115 and its write scheduler cause invalidation of chunks in response to write requests from the host system 120. The scrubber function invalidates chunks and moves valid data based on various criteria such as RBER and latency, as well as, criteria for low write count or codeword type. The wear-leveling manager 113 categorizes the invalidated chunks by write count depending on a number of defined buckets or groups (Block 515). For example, the wear-leveling manager 113 can group and sort invalid chunks into high write count, average write count, and low write count chunks. In some embodiments, the invalid chunks can also be sorted according to codeword type to avoid partition collision and bus dead time.

The wear-leveling manager 113 stores references and relevant metadata for each of the categorized and sorted invalid chunks in a tracking structure 415 (Block 520). The wear-leveling manager 113 can store references into a set of FIFOs, queues, or similar structures. Any number of structures within the tracking structure 415 can be utilized to store and organize references to invalid chunks to manage wear and avoid partition collision. In response to a write request, a write scheduler of the controller 115 can request a set of invalid chunks, e.g., a cartridge to service the write request. The wear-leveling manager 113 can implement a distribution algorithm to determine which of a set of available invalid chunks, e.g., cartridges, are to be provided in response to the request from the write scheduler (Block 525). The distribution algorithm can bias the selection of invalid chunks to select low write count invalid chunks or to similarly bias the selection to promote even wear in the memory subsystem 110. The wear-leveling manager may then increment the write count of the selected invalid chunks (Block 535).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 6:
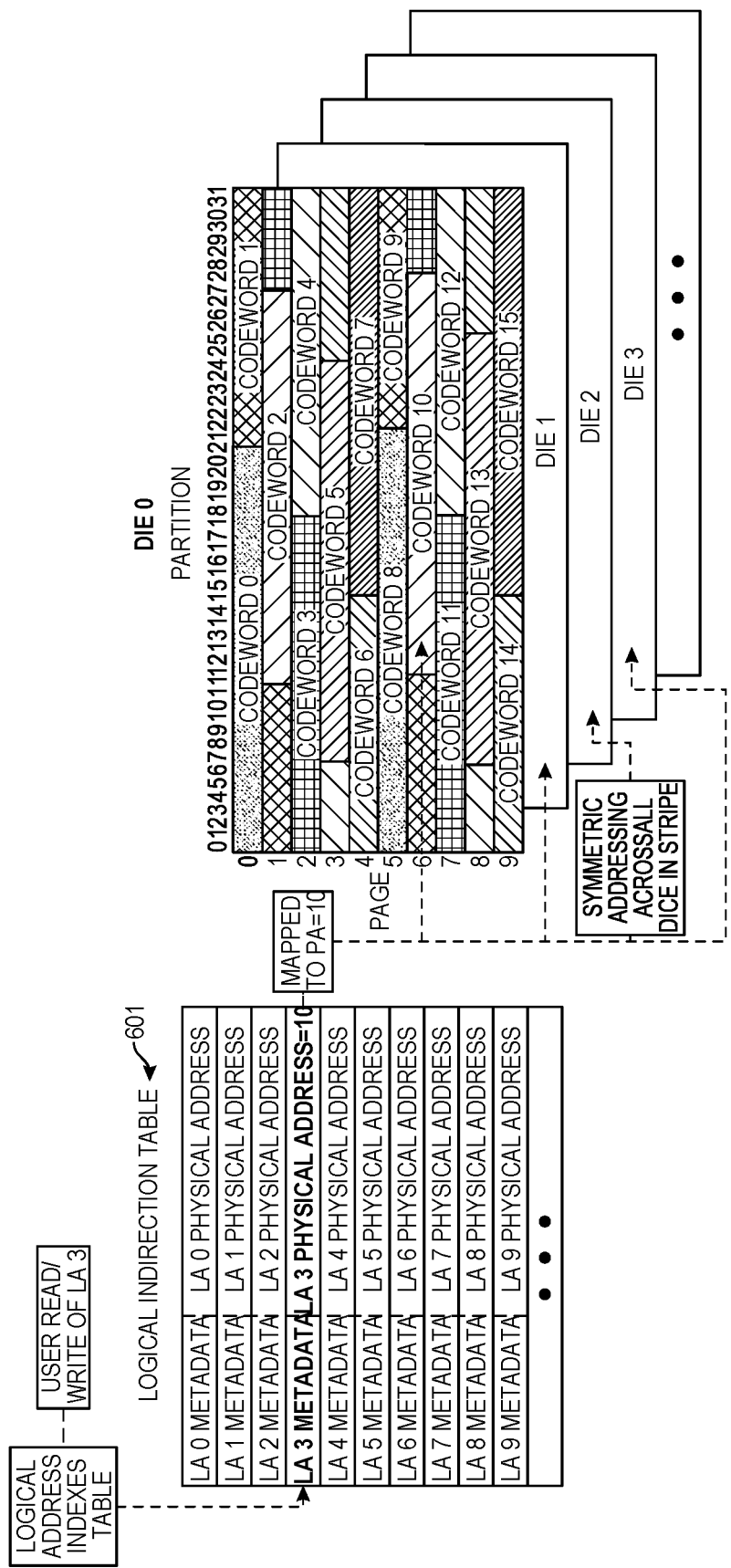
FIG. 6 is a diagram of one embodiment of a process of address translation using an indirection table.

FIG. 6 is a diagram of one embodiment of an address translation process using the indirection tables of the embodiments. In embodiments employing indirection tables, the controller 115 translates address received in write requests from the host system 120. The controller 115 can utilize an indirection table 601 such as a logical managed unit table. In this example embodiment, codewords are local to a specific die in the memory components 112A to 112N. The codewords are striped across a set of partitions to enable pipelined access. Managed units or similar chunks are composed of a set of codewords striped across a set of dice. When the controller 115 receives a logical address, e.g., logical address (LA) 3, the controller 115 uses the logical address as an index into the indirection table 601 and the physical address (PA), e.g., PA 10. The physical address is symmetrical across the set of dice. Thus, accessing PA 10 simultaneously accesses the location at each die.

The controller 115 also implements writes to the memory components 112A to 112N. The controller 115 receives a write request from a host system 120. The controller 115 uses the logical address (e.g., LA 3) to index the indirection table 601. A physical address (e.g., PA 10) is determined from the mapping of the indirection table 601. The controller invalidates the chunk at the mapped physical address and therefore the chunk becomes unmapped, i.e., the physical address is not associated with a valid entry in the indirection table 601. The write scheduler of the controller 115 then requests a chunk from the wear-leveling manager 'A13 and/or cartridge manager 121.

The wear-leveling manager 113 and/or cartridge manager 121 provides a next chunk (e.g., a managed unit) reference to the write scheduler according to one of the embodiments described herein above. The controller 115 encodes data from the host system 120 and writes the encoded data into the chunk provided by the wear-leveling manager 113 and/or cartridge manager 121. The controller 115 updates the indirection table to map the received logical address from the write request to the physical address of the chunk selected by the wear-leveling manager 113 or cartridge manager 121. The wear-leveling manager 113 determines the codeword type of the invalidated chunk and places a reference to the invalidated chunk into the tracking structure 415 according to the wear-leveling scheme.

Figure 7:
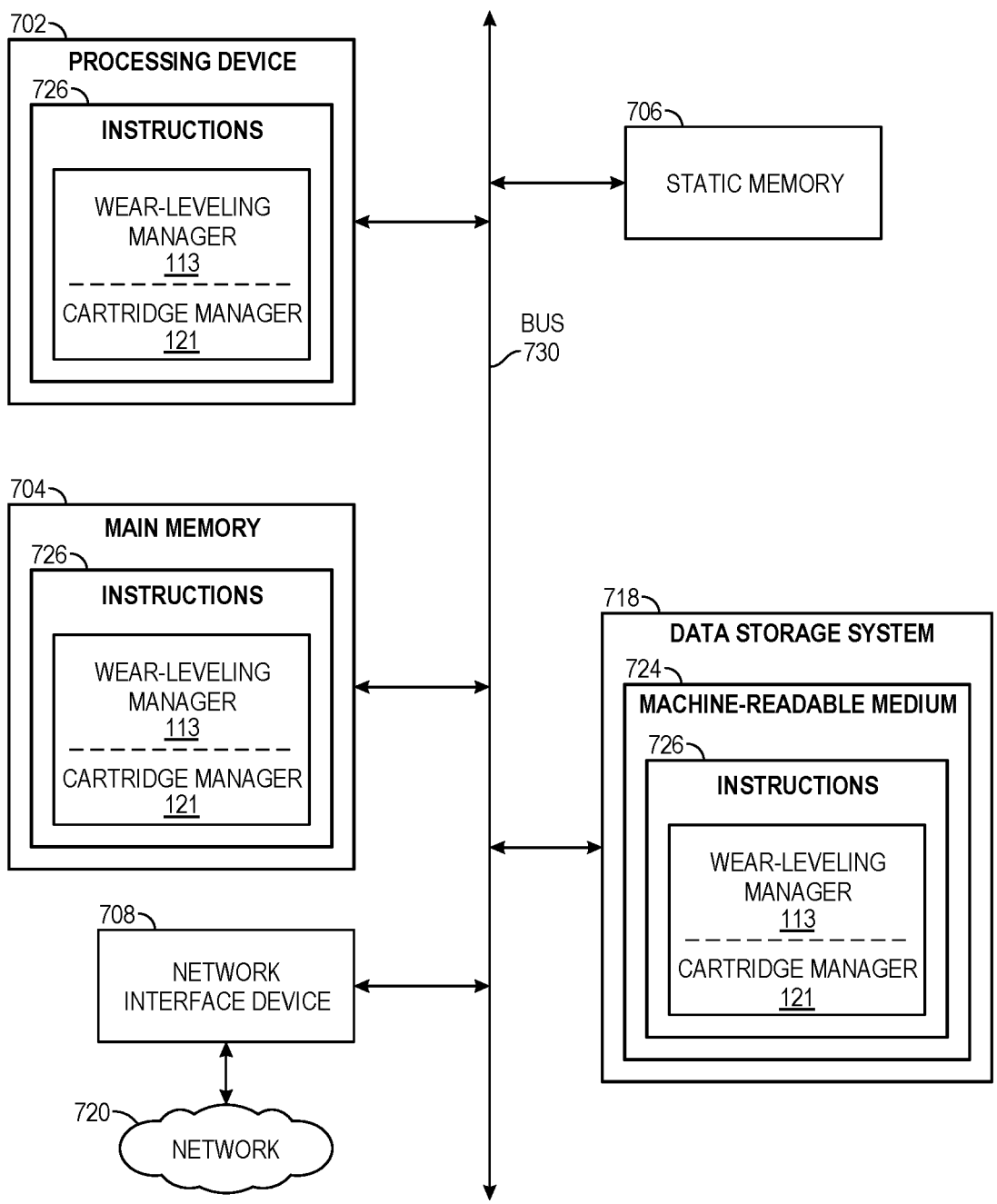
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the wear-leveling manager 113 and/or cartridge manager 121 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory subsystem 110 of FIG. 1.

In one embodiment, the instructions 726 include instructions to implement functionality corresponding to a wear-leveling and/or partition collision avoidance component (e.g., the wear-leveling manager 113 and/or cartridge manager 121 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. For example, a computer system or other data processing system, such as the controller 115, may carry out the computer-implemented method for wear-leveling and partition collision avoidance in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   categorizing chunks of memory by codeword type, wherein codeword type indicates a sequence of partitions spanned by a codeword and each chunk includes one or more codewords of a same codeword type;
   organizing the categorized chunks into a cartridge, which is a set of chunks ordered by codeword type to avoid partition write collision between the chunks in the cartridge when the cartridge is utilized for a write;
   receiving a write request; and
   fulfilling the write request using the cartridge.

2. The method of claim 1, wherein categorizing chunks of memory includes determining a codeword type by converting a physical address of each chunk of memory to a starting partition and page offset.

3. The method of claim 1, wherein organizing the categorized chunks into a cartridge includes tracking an order of the chunks of memory in a queue.

4. The method of claim 1, further comprising:
   receiving references to invalidated chunks and a write count for each of the invalidated chunks of a memory subsystem; and
   ordering the received references to the invalidated chunks of the memory subsystem in a tracking structure based on the write count of each of the invalidated chunks, wherein the chunks of memory are wear-leveled by biasing the order of the invalidated chunks to prioritize low write count chunks.

5. The method of claim 1, wherein at least a portion of the chunks of memory were invalidated when overwritten.

6. The method of claim 1, wherein at least a portion of the chunks of memory were invalidated in response to identifying that the chunks have a low write count.

7. The method of claim 1, wherein the cartridge includes one of each codeword type.

8. A non-transitory computer-readable storage medium comprising instructions that, when executed by a processing device, cause the processing device to:
   categorize chunks of memory by codeword type, wherein codeword type indicates a sequence of partitions spanned by a codeword and each chunk includes one or more codewords of a same codeword type;
   organize the categorized chunks into a cartridge, which is a set of chunks ordered by codeword type to avoid partition write collision between the chunks in the cartridge when the cartridge is utilized for a write;
   receive a write request; and
   fulfill the write request using the cartridge.

9. The non-transitory computer-readable storage medium of claim 8, wherein categorizing chunks of memory includes determining a codeword type by converting a physical address of each chunk of memory to a starting partition and page offset.

10. The non-transitory computer-readable storage medium of claim 8, wherein organizing the categorized chunks into a cartridge includes tracking an order of the chunks of memory in a queue.

11. The non-transitory computer-readable storage medium of claim 8, having further instructions that, when executed by the processing device, cause the processing device to:
   receive references to invalidated chunks and a write count for each of the invalidated chunks of a memory subsystem; and
   order the received references to the invalidated chunks of the memory subsystem in a tracking structure based on the write count of each of the invalidated chunks, wherein the chunks of memory are wear-leveled by biasing the order of the invalidated chunks to prioritize low write count chunks.

12. The non-transitory computer-readable storage medium of claim 8, wherein at least a portion of the chunks of memory were invalidated when overwritten.

13. The non-transitory computer-readable storage medium of claim 8, wherein at least a portion of the chunks of memory were invalidated in response to identifying that the chunks have a low write count.

14. The non-transitory computer-readable storage medium of claim 8, wherein the cartridge includes one of each codeword type.

15. A system comprising:
   a memory component; and
   a processing device, operatively coupled with the memory component, to
      categorize chunks of memory by codeword type, wherein codeword type indicates a sequence of partitions spanned by a codeword and each chunk includes one or more codewords of a same codeword type;
      organize the categorized chunks into a cartridge, which is a set of chunks ordered by codeword type to avoid partition write collision between the chunks in the cartridge when the cartridge is utilized for a write, wherein the cartridge includes one of each codeword type;
      receive a write request; and
      fulfill the write request using the cartridge.

16. The system of claim 15, wherein categorizing chunks of memory includes determining a codeword type by converting a physical address of each chunk of memory to a starting partition and page offset.

17. The system of claim 15, wherein organizing the categorized chunks into a cartridge includes tracking an order of the chunks of memory in a queue.

18. The system of claim 15, wherein the processing device is further to:
   receive references to invalidated chunks and a write count for each of the invalidated chunks of a memory subsystem; and
   order the received references to the invalidated chunks of the memory subsystem in a tracking structure based on the write count of each of the invalidated chunks, wherein the chunks of memory are wear-leveled by biasing the order of the invalidated chunks to prioritize low write count chunks.

19. The system of claim 15, wherein at least a portion of the chunks of memory were invalidated when overwritten.

20. The system of claim 15, wherein at least a portion of the chunks of memory were invalidated in response to identifying that the chunks have a low write count.

* * * * *